(12) United States Patent
Takamizawa

(10) Patent No.: US 11,266,009 B2
(45) Date of Patent: Mar. 1, 2022

(54) CIRCUIT DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Shun Takamizawa, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/056,147

(22) PCT Filed: Apr. 26, 2019

(86) PCT No.: PCT/JP2019/017844
§ 371 (c)(1),
(2) Date: Nov. 17, 2020

(87) PCT Pub. No.: WO2019/220927
PCT Pub. Date: Nov. 21, 2019

(65) Prior Publication Data
US 2021/0315095 A1    Oct. 7, 2021

(30) Foreign Application Priority Data

May 17, 2018 (JP) .............................. JP2018-095167

(51) Int. Cl.
*H05K 1/02* (2006.01)
(52) U.S. Cl.
CPC ..... *H05K 1/0209* (2013.01); *H05K 2201/066* (2013.01)

(58) Field of Classification Search
CPC .......... H05K 1/0209; H05K 2201/066; H02M 7/003
See application file for complete search history.

(56) References Cited

U.S. PATENT DOCUMENTS

| 6,016,006 | A |   | 1/2000 | Kolman et al. |
| 9,999,159 | B2 | * | 6/2018 | Yamanaka ............. H02K 11/33 |

(Continued)

FOREIGN PATENT DOCUMENTS

| JP | 2003-168772 A | 6/2003 |
| JP | 2006-165279 A | 6/2006 |

(Continued)

OTHER PUBLICATIONS

International Search Report, Application No. PCT/JP2019/017844, dated Jul. 16, 2019. ISA/Japan Patent Office.

*Primary Examiner* — Mukundbhai G Patel
(74) *Attorney, Agent, or Firm* — Honigman LLP

(57) ABSTRACT

A circuit device 1 includes: a circuit assembly including a circuit board; a heat sink; and heat dissipation grease. The heat sink includes a main plate portion disposed to face the circuit board, and boss portions protruding from the main plate portion toward the circuit board and abutting the circuit board, and is a member fixed to the circuit board by screwing. The heat dissipation grease is a heat transfer material that is interposed between the circuit board and the main plate portion, and has fluidity. The main plate portion includes, on a heat transfer surface facing the circuit board, a first grease application region to which the heat dissipation grease is applied. The circuit board includes a shielding wall extending from a heat dissipation surface facing the main plate portion toward an intermediate region between the first boss portion and the first grease application region in the main plate portion.

3 Claims, 16 Drawing Sheets

(56) References Cited

U.S. PATENT DOCUMENTS

2007/0211433 A1    9/2007  Maeno
2016/0295683 A1*  10/2016  Uchida .............. H05K 7/20463
2017/0353020 A1*  12/2017  Yamashita ......... H05K 7/20445

FOREIGN PATENT DOCUMENTS

| | | |
|---|---|---|
| JP | 2010-205863 A | 9/2010 |
| JP | 2012-191002 A | 10/2012 |
| JP | 2015-126105 A | 7/2015 |
| JP | 2018-170895 A | 11/2018 |

* cited by examiner

CIRCUIT DEVICE

CROSS-REFERENCE TO RELATED APPLICATIONS

This application is the U.S. national stage of PCT/JP2019/017844 filed on Apr. 26, 2019, which claims priority of Japanese Patent Application No. JP 2018-095167 filed on May 17, 2018, the contents of which are incorporated herein.

TECHNICAL FIELD

The technique disclosed in the present specification relates to a circuit device.

BACKGROUND

A circuit device including a circuit board and a heat dissipation member that is fixed to the circuit board by screws and dissipates heat generated from the circuit board is known. A seat portion having screw holes protrudes from the heat dissipation member, and the circuit board is fixed to the heat dissipation member by screws that pass through the circuit board and are screwed into the seat portion. In such a circuit device, heat dissipation grease having a function of transferring heat generated from the circuit board to the heat dissipation member may be disposed between the circuit board and the heat dissipation member (see When the circuit board is fixed to the heat dissipation member, heat dissipation grease is applied to the surface of the heat dissipation member, the circuit board is then placed on the seat portion, and screws are passed through the circuit board and screwed into the seat portion. If the heat dissipation grease is spread between the circuit board and the heat dissipation member and reaches the seat portion during screwing, the heat dissipation grease may enter a gap between the seat portion and the circuit board and make it difficult to manage the thickness of the heat dissipation grease, or the heat dissipation grease may enter the screw holes and make it difficult to manage the torque of the screws, which may cause a problem in the assembly process.

SUMMARY

A circuit device disclosed in the present specification includes: a circuit assembly including a circuit board; a fixed member that includes a base portion disposed to face the circuit board, and a pedestal portion protruding from the base portion toward the circuit board and abutting the circuit board, and that is fixed to the circuit board by screwing; and a heat transfer material interposed between the circuit board and the base portion, and having fluidity, wherein the base portion includes, on a first facing surface facing the circuit board, a heat transfer material application region to which the heat transfer material is applied, and the circuit board includes a shielding wall extending from a second facing surface facing the base portion toward an intermediate region between the pedestal portion and the heat transfer material application region in the base portion.

According to the above configuration, the heat transfer material that is pushed and spread between the circuit board and the fixed member at the time of screwing is held by the shielding wall. As a result, the heat transfer material is prevented from reaching the pedestal portion and entering a gap between the pedestal portion and the circuit board to cause problems in an assembling process.

In the above configuration, the fixed member may also be a heat dissipation member. Alternatively, the circuit assembly may also include a heat generating component that is mounted on the circuit board and generates heat when electricity flows therethrough, and the fixed member may also be a covering member that covers the heat generating component.

In the above configuration, the base portion may also include a groove that is recessed from a surface facing the circuit board at a position overlapping the shielding wall.

According to such a configuration, by using the shielding wall and the groove, it is possible to reliably prevent the heat transfer material from reaching the pedestal portion and causing a problem in the assembly process.

Advantageous Effects of Invention

According to the circuit device disclosed in the present specification, it is possible to avoid a problem in the assembly process.

DETAILED DESCRIPTION OF PREFERRED EMBODIMENTS

First Embodiment

A first embodiment will be described with reference to FIGS. 1 to 8. A circuit device 1 of the present embodiment is a device used as a DC-DC converter, an AC/DC inverter, or the like disposed between a battery and various in-vehicle electrical components in a vehicle such as an electric vehicle or a hybrid vehicle. As shown in FIG. 7, the circuit device 1 includes a circuit assembly 10, a heat sink 20 (corresponding to a fixed member and a heat dissipation member) screwed to the circuit assembly 10, a shielding wall 15 mounted on the circuit assembly 10, and heat dissipation grease G (corresponding to a heat transfer material) interposed between the circuit assembly 10 and the heat sink 20.

Figure 1:
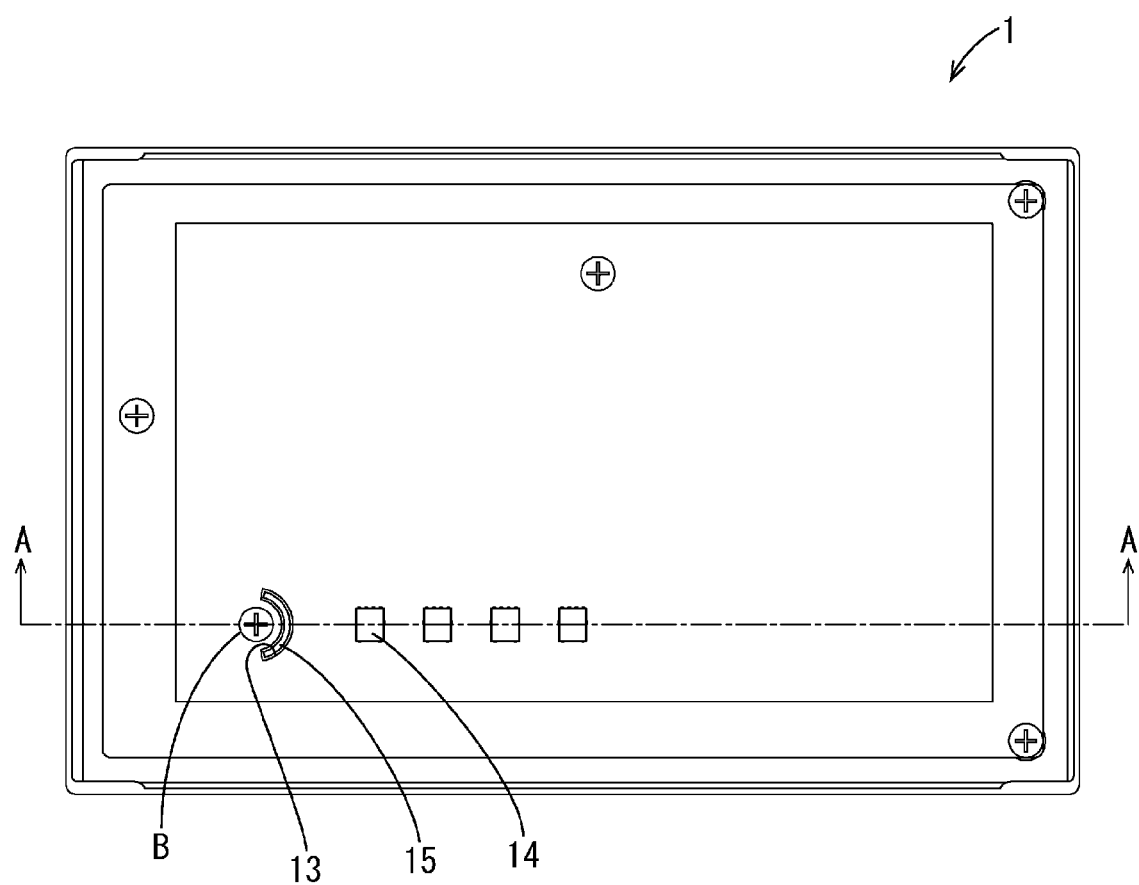
FIG. 1 is a plan view of a circuit device of a first embodiment.
Figure 2:
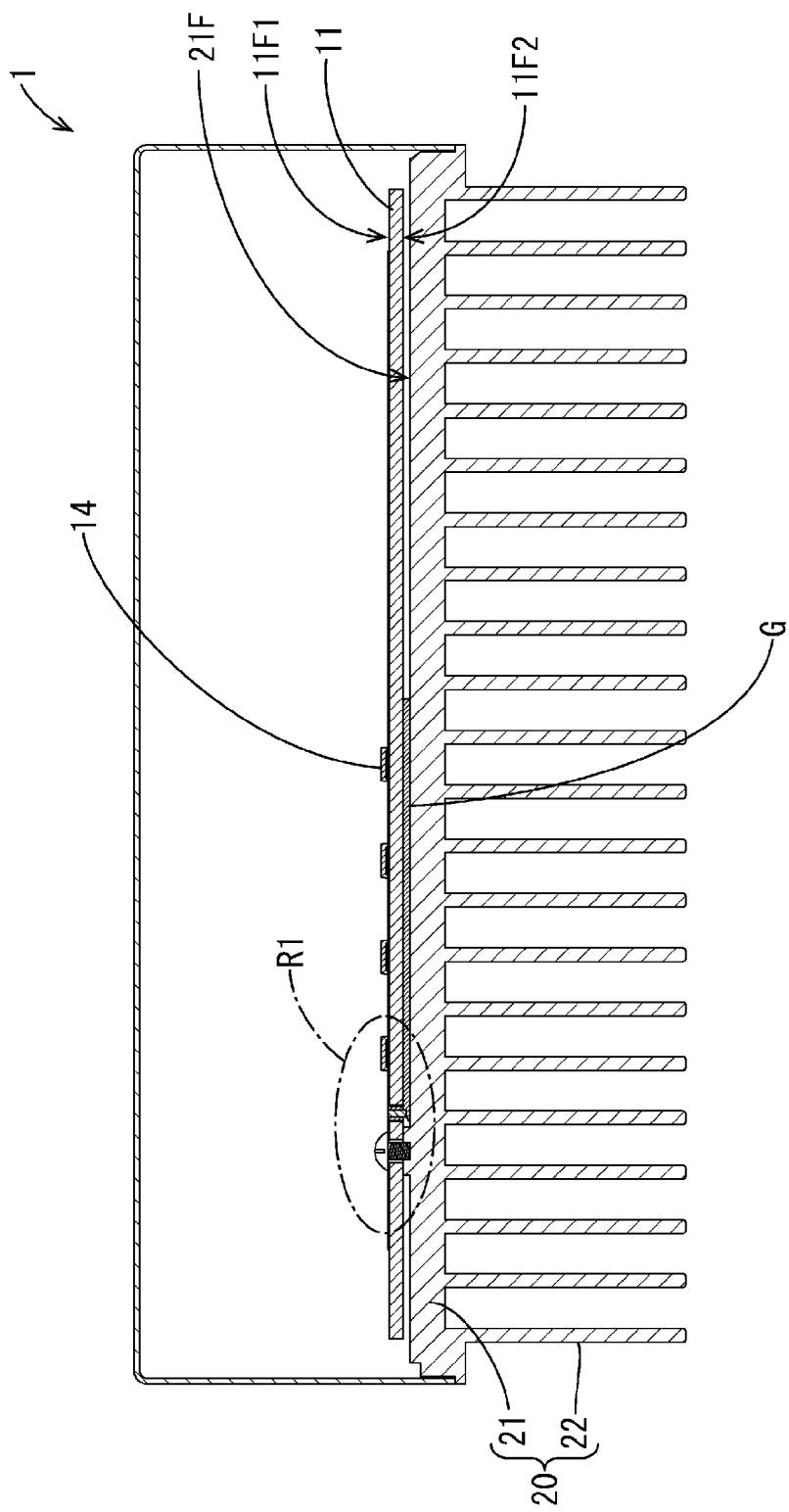
FIG. 2 is a cross-sectional view taken along line A-A of FIG. 1.
Figure 3:
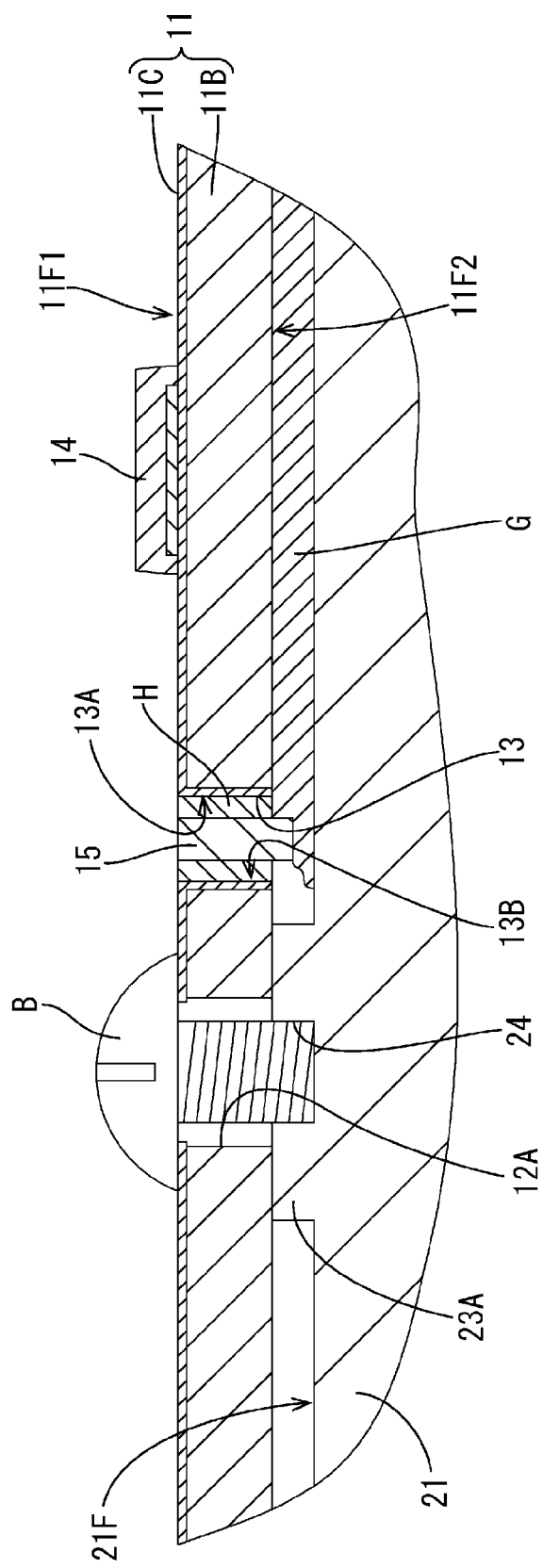
FIG. 3 is an enlarged view of a region R1 in FIG. 2.

As shown in FIG. 7, the circuit assembly 10 includes a circuit board 11 and a plurality of semiconductor switching elements 14 mounted on the circuit board 11. As shown in FIG. 3, the circuit board 11 has a general configuration in which a conductive circuit 11C is formed by a printed wiring technology on one surface of an insulating plate 11B made of a glass base material or a glass nonwoven fabric base material. In FIGS. 1 and 7, the conductive circuit 11C is omitted to schematically show the entire circuit board 11. As shown in FIGS. 1, 2, and 7, the plurality of semiconductor switching elements 14 are disposed in a line on one surface (a mounting surface 11F1: the upper surface in FIG. 2) of the front and back surfaces of the circuit board 11.

As shown in FIG. 7, the circuit board 11 includes a plurality of screw insertion holes 12A and 12B through which screws B for assembling the circuit board 11 and the heat sink 20 can be inserted. One of the plurality of screw insertion holes 12A and 12B is a first screw insertion hole 12A disposed in the vicinity of the semiconductor switching elements 14. The plurality of other screw insertion holes 12B are disposed in the circumferential edge portion of the circuit board 11.

Figure 5:
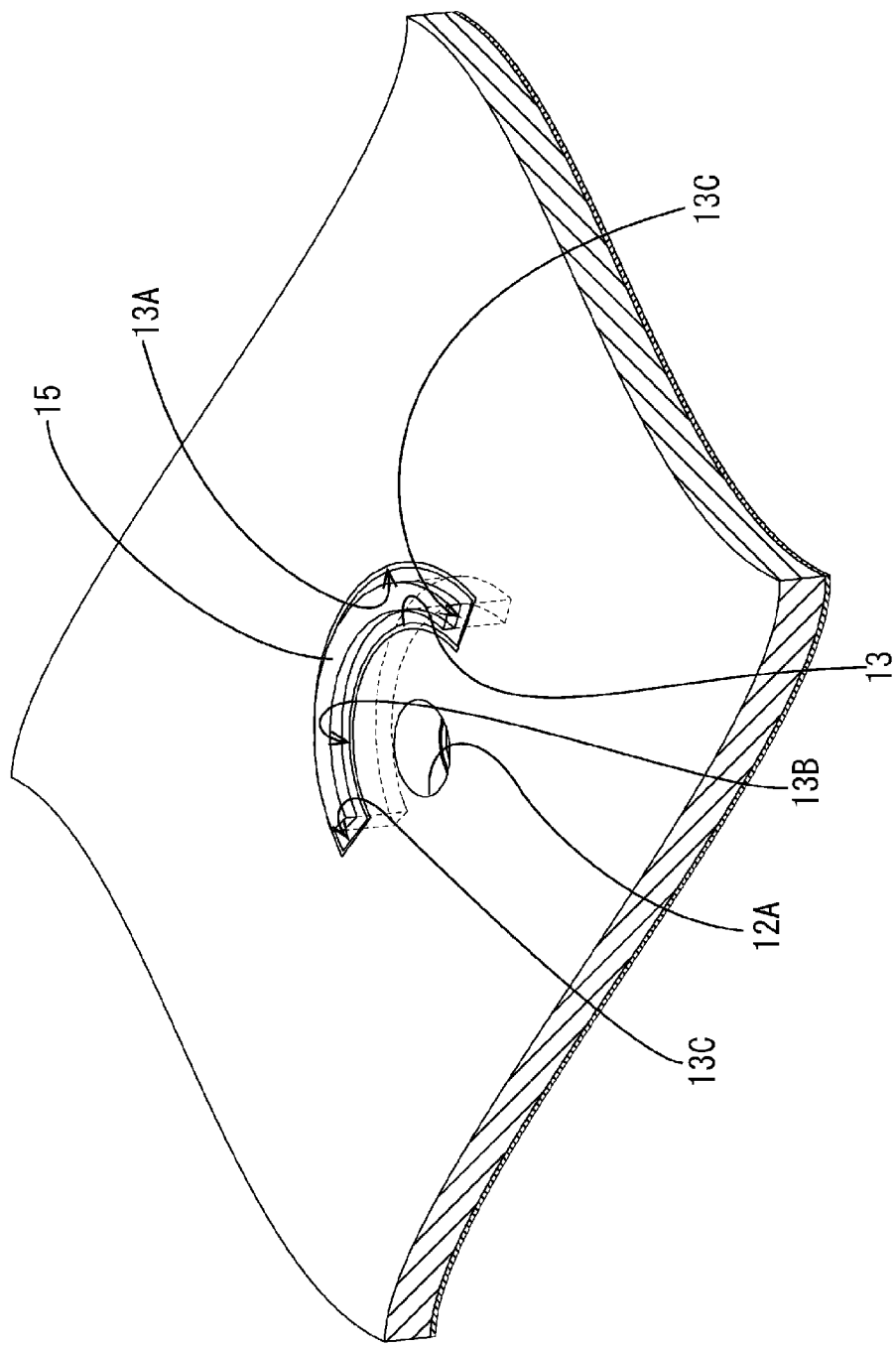
FIG. 5 is a partially enlarged perspective view of a portion on which the shielding wall is mounted in the circuit board of the first embodiment as viewed from a heat dissipation surface side.

The circuit board 11 includes a mounting hole 13 for mounting the shielding wall 15. As shown in FIGS. 3 and 5, the mounting hole 13 is defined by a pair of half-pipe-shaped curved walls 13A and 13B disposed at a distance from each other and a pair of connecting walls 13C connecting the two curved walls 13A and 13B, and is a hole penetrating the circuit board 11. As shown in FIGS. 1 and 3, the mounting hole 13 is disposed between the first screw insertion hole 12A and the semiconductor switching elements 14, and as shown in FIG. 5, the two curved walls 13A and 13B are curved toward the first screw insertion hole 12A.

Figure 4:
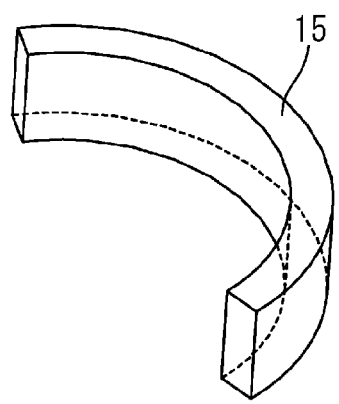
FIG. 4 is a perspective view of a shielding wall of the first embodiment.

The shielding wall 15 is made of metal, and is a plate-like member curved in a half-pipe shape as shown in FIG. 4. As shown in FIGS. 1, 3, and 5, most of the shielding wall 15 is accommodated in the mounting hole 13, and a part of the shielding wall 15 protrudes from the other surface (a heat dissipation surface 11F2: the lower surface in FIG. 2: corresponding to a second facing surface) of the front and back surfaces of the circuit board 11, and is curved toward the first screw insertion hole 12A. As shown in FIG. 3, the gaps between the inner wall surfaces (the curved walls 13A and 13B, and the connecting walls 13C) of the mounting hole 13 and the shielding wall 15 are filled with solder H, whereby the shielding wall 15 is fixed to the circuit board 11.

The heat sink 20 is a member made of metal such as aluminum or an aluminum alloy having high thermal conductivity, and includes a main plate portion 21 (corresponding to a base portion) disposed to face the circuit board 11, and a plurality of heat dissipation fins 22 protruding from the main plate portion 21, as shown in FIG. 2. The main plate portion 21 is a plate-shaped portion that is slightly larger than the circuit board 11. The plurality of heat dissipation fins 22 are plate-shaped portions protruding perpendicularly to the main plate portion 21 from one surface (the lower surface in FIG. 2) of both front and back surfaces of the main plate portion 21, and are parallel to each other.

The other surface (the upper surface in FIG. 2) of the front and back surfaces of the main plate portion 21 is a heat transfer surface 21F (corresponding to a first facing surface) facing the circuit board 11, and as shown in FIG. 7, a plurality of boss portions 23A and 23B serving as pedestals for supporting the circuit board 11 protrude from the heat transfer surface 21F. As shown in FIG. 7, each of the plurality of boss portions 23A and 23B has a cylindrical shape, and as shown in FIG. 3, has a screw hole 24 that opens to a surface facing the circuit board 11. The plurality of boss portions 23A and 23B are disposed at positions corresponding to the screw insertion holes 12A and 12B of the circuit board 11, respectively. One of the plurality of boss portions 23A and 23B is a first boss portion 23A (corresponding to a pedestal portion) disposed at a position corresponding to the first screw insertion hole 12A. The plurality of other boss portions 23B are disposed at positions corresponding to the plurality of other screw insertion holes 12B.

Figure 6:
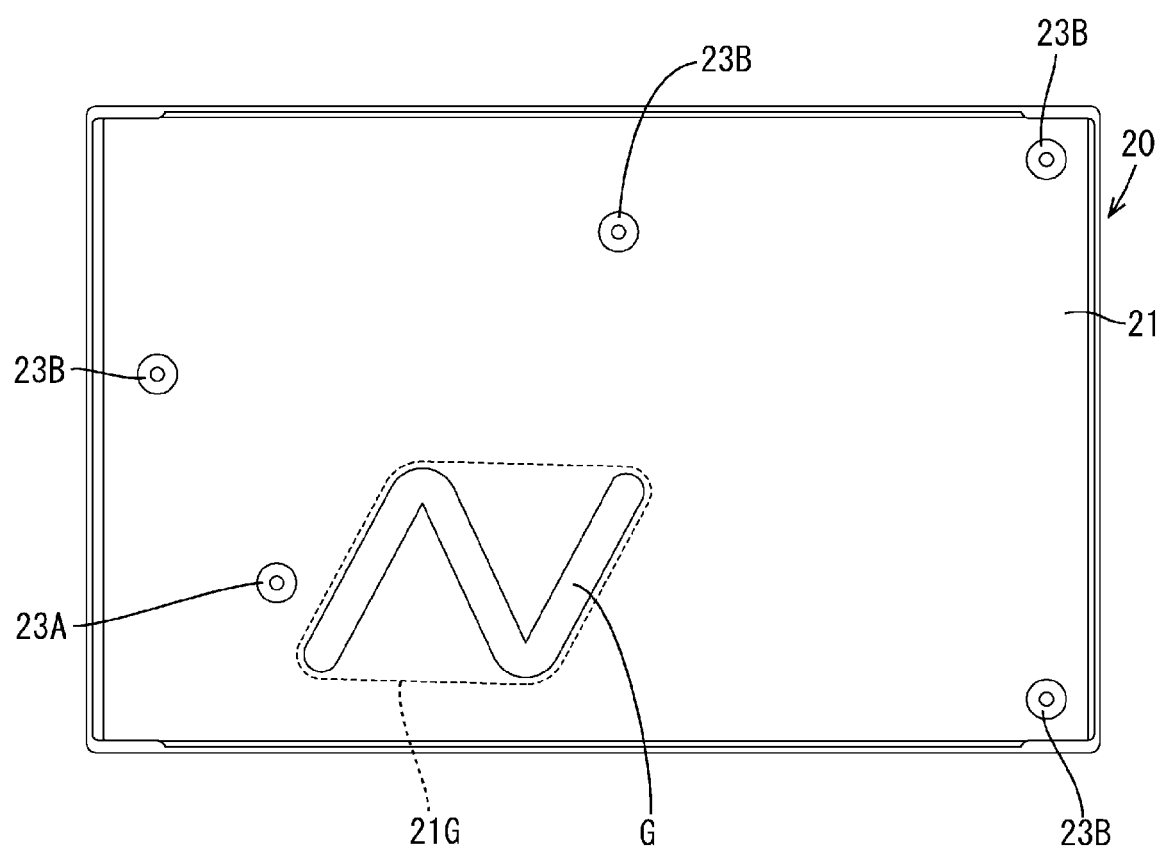
FIG. 6 is a plan view of a heat sink to which heat dissipation grease is applied in the first embodiment.
Figure 7:
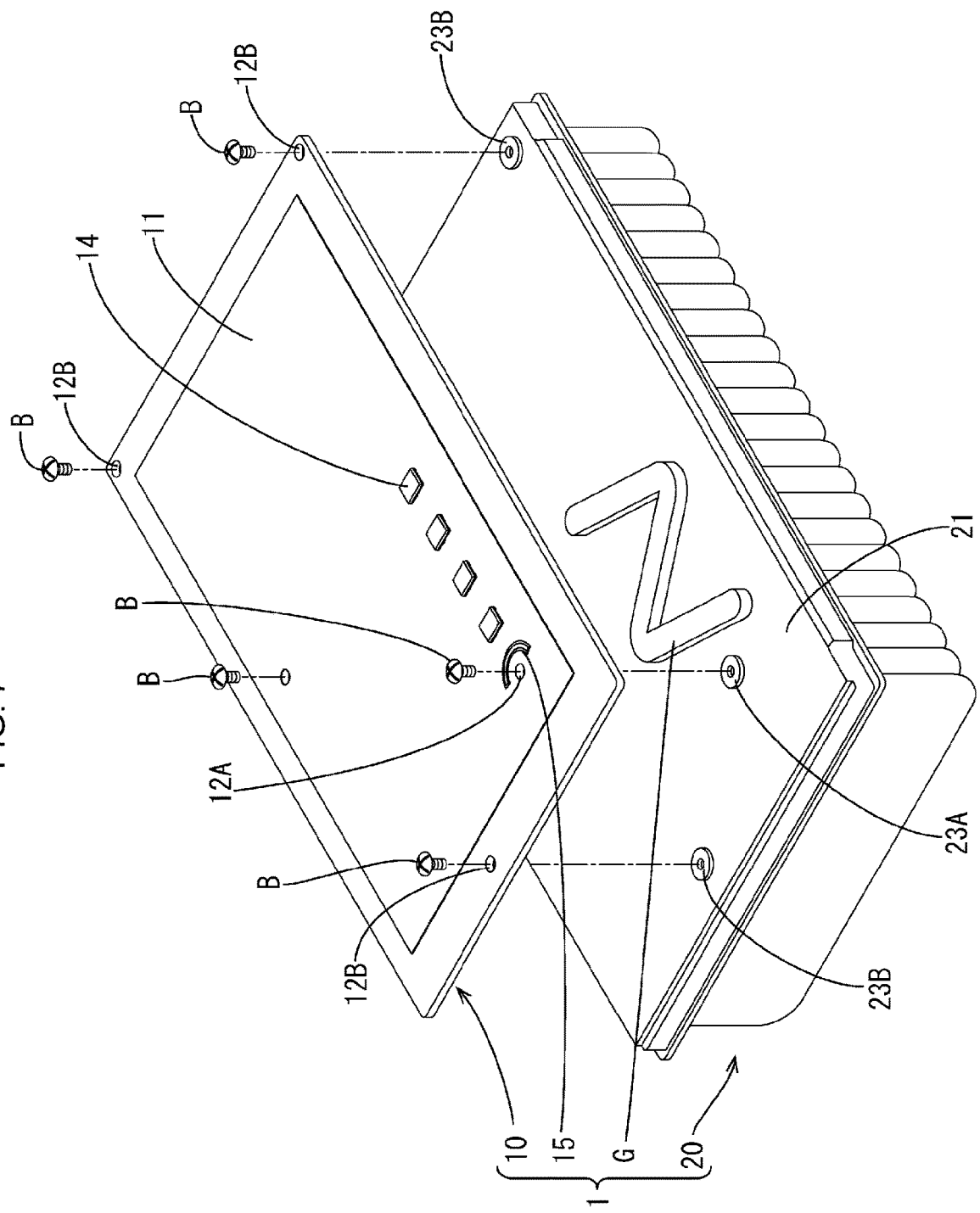
FIG. 7 is a perspective view showing a state in which the circuit assembly is assembled to the heat sink in the first embodiment.

As shown in FIG. 6, a part of the heat transfer surface 21F is a first grease application region 21G to which the heat dissipation grease G is applied when the circuit board 11 and the heat sink 20 are assembled. The first grease application region 21G is located in a region overlapping the semiconductor switching elements 14 (a region directly below the plurality of semiconductor switching elements 14 in FIG. 2) in a state where the circuit board 11 is assembled to the heat sink 20.

The circuit board 11 is supported on the plurality of boss portions 23A and 23B with the heat dissipation surface 11F2 facing the main plate portion 21. The plurality of screws B are respectively inserted into the plurality of screw insertion holes 12A and 12B and screwed into the boss portions 23A and 23B, whereby the circuit board 11 is fixed to the heat sink 20. Between the circuit board 11 and the main plate portion 21, there is a gap corresponding to the height of the boss portions 23A and 23B, and as shown in FIGS. 2 and 3, a part of the gap is filled with the heat dissipation grease G. More specifically, the heat dissipation grease G is interposed in a region overlapping the semiconductor switching elements 14 (a region directly below the plurality of semiconductor switching elements 14 in FIGS. 2 and 3) between the circuit board 11 and the main plate portion 21.

It is desirable that the heat dissipation grease G has a thermal conductivity higher than that of air, and immediately after being applied, the heat dissipation grease G has fluidity to such an extent that the heat dissipation grease G flows by pressurization from the circuit board 11 and the main plate portion 21 by fastening the screws B. It is also desirable that the heat dissipation grease G has a property of being gradually solidified to such an extent that the heat dissipation grease G does not drip down even when the circuit device 1 is inclined, due to volatilization of a solvent contained in the heat dissipation grease G, absorption of moisture in the air, or the like. Silicone grease can be used as the heat dissipation grease G, for example.

When electricity flows through the conductive circuit 11C formed on the circuit board 11, the plurality of semiconductor switching elements 14 generate heat. The generated heat is transmitted to the heat sink 20 via the heat dissipation grease G, and is dissipated from the heat sink 20.

The process of manufacturing the circuit device 1 as described above by assembling the circuit board 11 and the heat sink 20 will be described below.

First, as shown in FIG. 6, the heat dissipation grease G is applied to the first grease application region 21G of the heat sink 20. Next, as shown in FIG. 7, the circuit board 11 is placed on the boss portions 23A and 23B while aligning the plurality of screw insertion holes 12A and 12B with the plurality of boss portions 23A and 23B, respectively. In a state where the circuit board 11 is disposed at a predetermined position, the first grease application region 21G is disposed in a region overlapping the plurality of semiconductor switching elements 14 (a region directly below the plurality of semiconductor switching elements 14 in FIG. 2). Also, the shielding wall 15 extends toward an intermediate region between the heat dissipation grease G applied to the first grease application region 21G and the first boss portion 23A in a direction recessed toward the first boss portion 23A.

Figure 8:
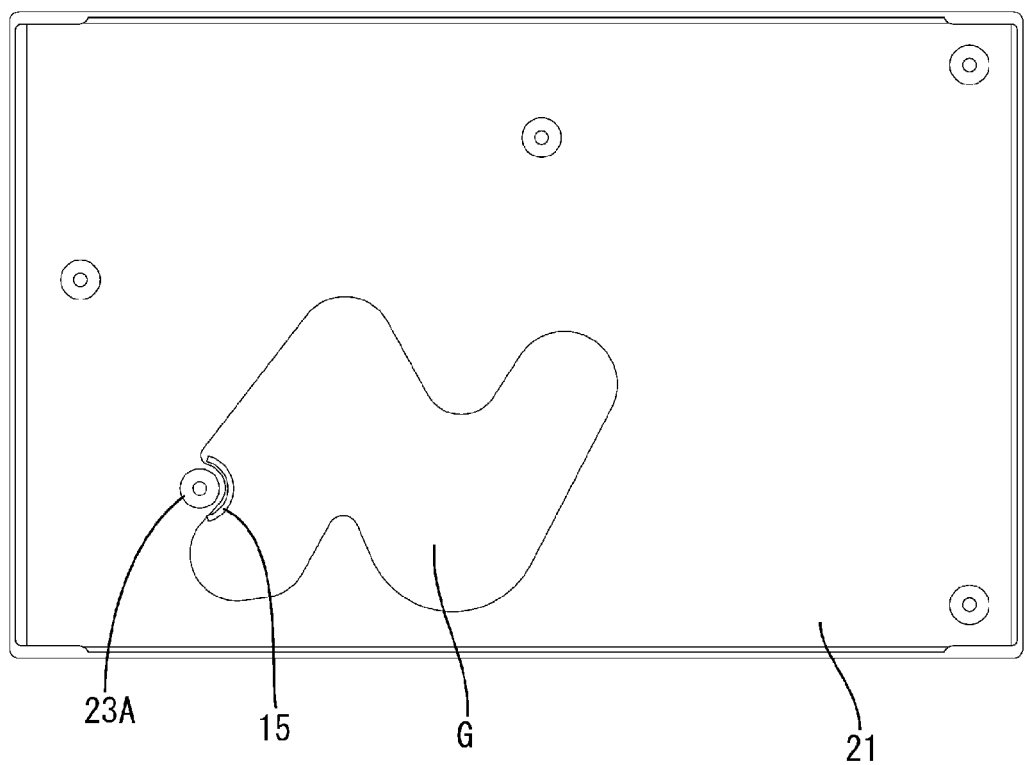
FIG. 8 is a plan view showing a state in which the heat dissipation grease applied to the heat sink is crushed and spread between the circuit board and a main plate portion when the circuit assembly is assembled in the first embodiment, with the circuit assembly omitted.

Next, the plurality of screws B are inserted into the plurality of screw insertion holes 12A and 12b, respectively, and are screwed into the plurality of boss portions 23A and 23B, respectively, thereby fixing the circuit board 11 to the heat sink 20. At this time, the heat dissipation grease G is crushed between the circuit board 11 and the main plate portion 21 due to the pressure applied by fastening the screws B, and spreads outward from the first grease application region 21G as shown in FIG. 8. Although a part of the heat dissipation grease G tends to spread toward the first boss portion 23A, the heat dissipation grease G is held by the shielding wall 15, as shown in FIGS. 3 and 8. Here, as shown in FIG. 3, the shielding wall 15 is suspended from the circuit board 11 toward the main plate portion 21, and the first boss portion 23A rises from the main plate portion 21 toward the circuit board 11. Accordingly, even if the heat dissipation grease G may slightly enter the vicinity of the bottom of the first boss portion 23A from the gap between the shielding wall 15 and the main plate portion 21, the heat dissipation grease G is prevented from seeping up the first boss portion 23A. As a result, the heat dissipation grease G is prevented from entering the gap between the first boss portion 23A and the circuit board 11, and becoming thicker than or equal to a set value. In addition, it is possible to avoid a situation in which the heat dissipation grease G enters the screw hole 24 of the first boss portion 23A and torque management of the screws B becomes difficult.

As described above, according to the present embodiment, the circuit device 1 includes the circuit assembly 10, the heat sink 20, and the heat dissipation grease G. The circuit assembly 10 includes the circuit board 11. The heat sink 20 includes the main plate portion 21 disposed to face the circuit board 11, and the boss portions 23A and 23B protruding from the main plate portion 21 toward the circuit board 11 and abutting the circuit board 11, and is a member fixed to the circuit board 11 by screwing. The heat dissipation grease G is a heat transfer material that is interposed between the circuit board 11 and the main plate portion 21, and has fluidity. The main plate portion 21 includes, on the heat transfer surface 21F facing the circuit board 11, the first grease application region 21G to which the heat dissipation grease G is applied. The circuit board 11 includes the shielding wall 15 extending from the heat dissipation surface 11F2 facing the main plate portion 21 toward the intermediate region between the first boss portion 23A and the first grease application region 21G in the main plate portion 21.

According to the above configuration, when the circuit board 11 and the heat sink 20 are screwed together, the heat dissipation grease G that is spread between the circuit board 11 and the heat sink 20 is held by the shielding wall 15. As a result, it is avoided that the heat dissipation grease G reaches the first boss portion 23A and enters the gap between the first boss portion 23A and the circuit board 11 to cause problems in the assembling process.

Modification

Figure 10:
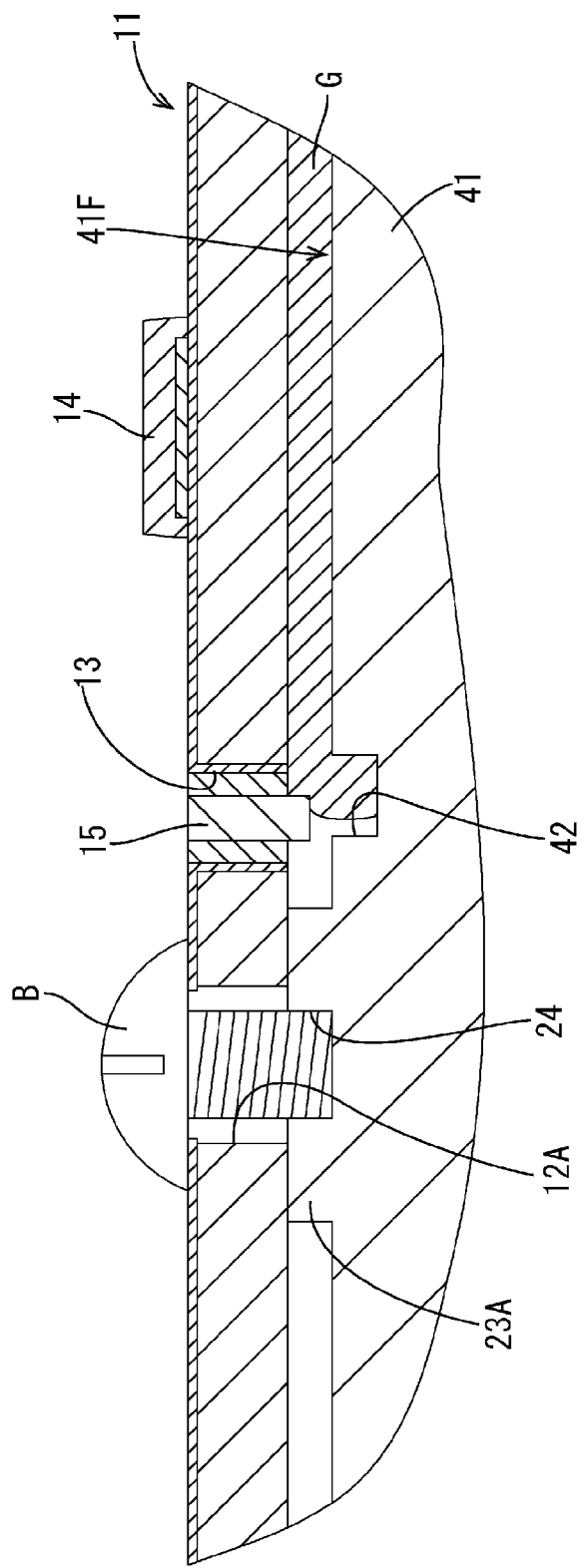
FIG. 10 is an enlarged view of a region R2 in FIG. 9.
Figure 11:
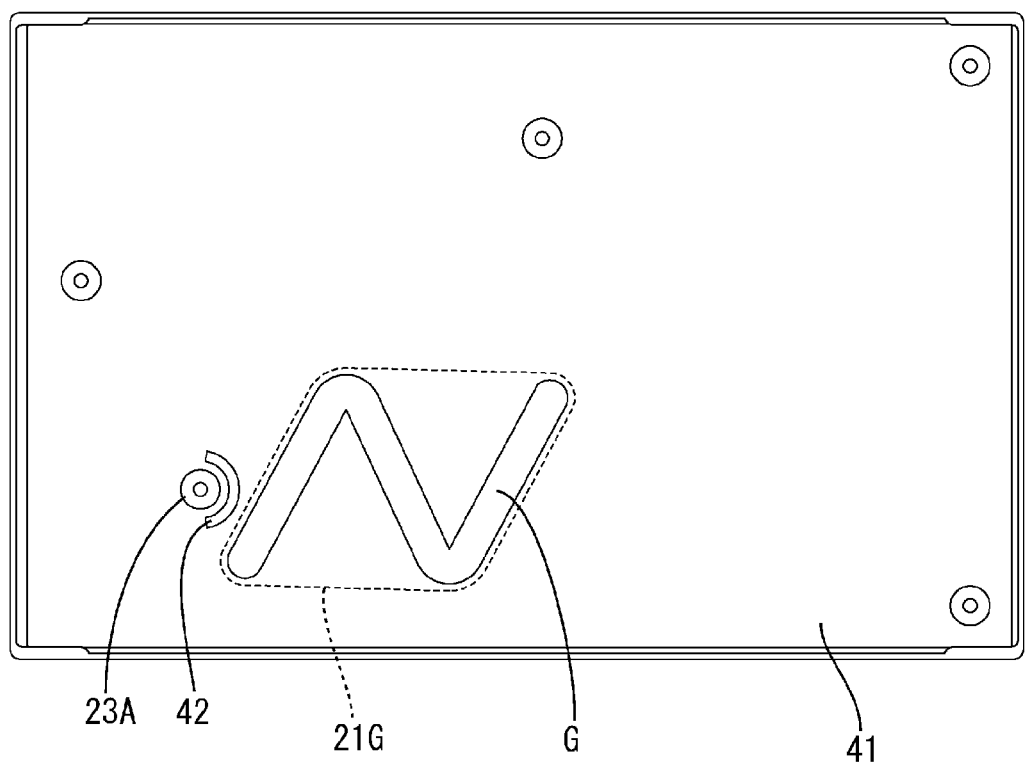
FIG. 11 is a plan view of a heat sink to which heat dissipation grease is applied in the modification.

A modification will be described with reference to FIGS. 9 to 11. Similarly to the first embodiment, a circuit device 30 of the modification includes: a circuit assembly 10 including a circuit board 11 and a plurality of semiconductor switching elements 14; a heat sink 40 screwed to the circuit assembly 10; a shielding wall 15 mounted on the circuit assembly 10; and heat dissipation grease G interposed between the circuit assembly 10 and the heat sink 40 (see FIG. 9).

Figure 9:
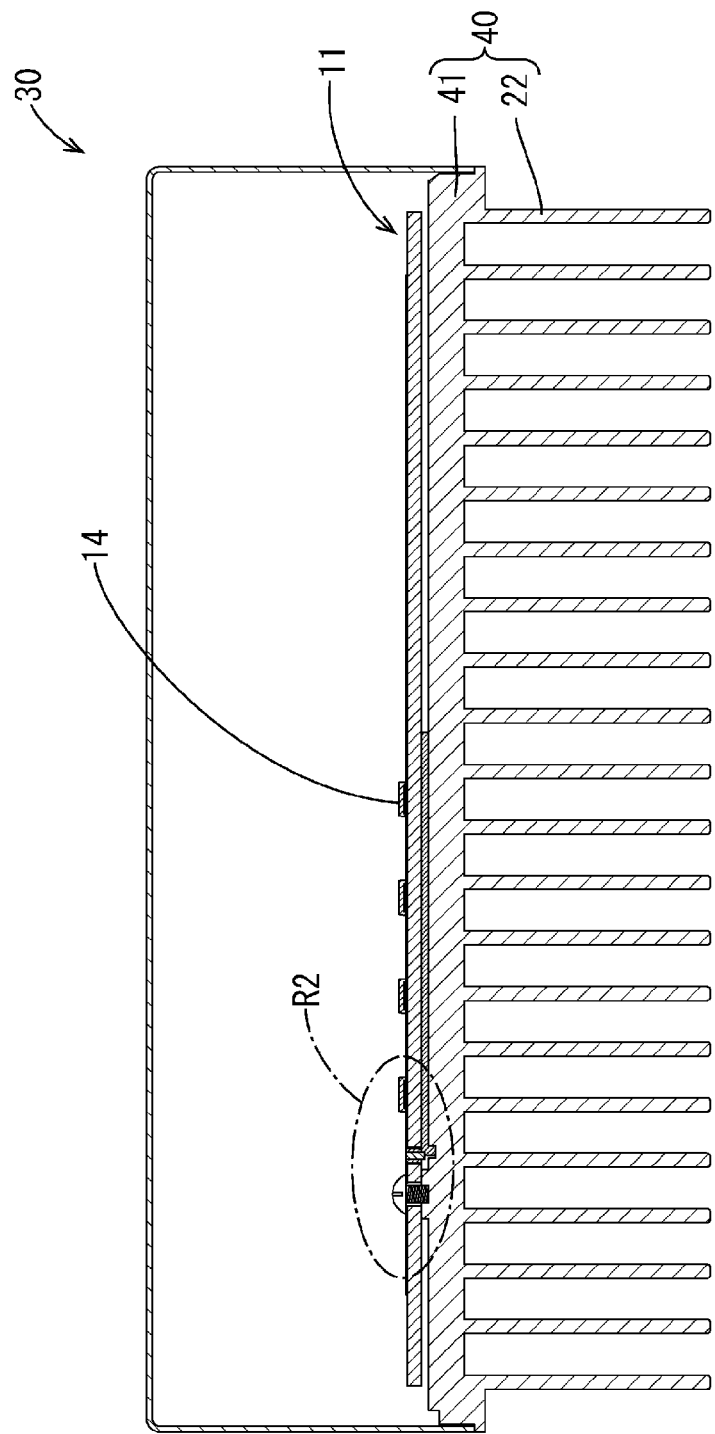
FIG. 9 is a cross-sectional view of a circuit device according to a modification taken along line A-A of FIG. 1.

Similarly to the embodiment, the heat sink 40 includes a plate-shaped main plate portion 41 disposed to face the circuit board 11, and a plurality of heat dissipation fins 22 protruding from the main plate portion 41 (see FIG. 9).

The heat sink 40 includes a damming groove 42 (corresponding to a groove). As shown in FIG. 10, the damming groove 42 is a groove that is recessed from the heat transfer surface 41F (corresponding to a first facing surface) facing the circuit board 11 in the main plate portion 41. Also, as shown in FIG. 11, the damming groove 42 is disposed between the first boss portion 23A and the first grease application region 21G, and extends while being curved and recessed toward the first boss portion 23A side. As shown in FIG. 10, the damming groove 42 is disposed in a region overlapping the shielding wall 15 (a region directly below the shielding wall 15 in FIG. 10) in a state where the circuit board 11 is assembled to the heat sink 40. The damming groove 42 may also not completely overlap the shielding wall 15, and a part of the damming groove 42 may also be slightly shifted.

Because the other structural features are the same as those of the first embodiment, the same reference numerals are given to the same structural features, and the description thereof will be omitted.

According to the present modification, by using both the shielding wall 15 and the damming groove 42, it is possible to reliably prevent the heat dissipation grease G from reaching the first boss portion 23A and interfering with the assembly process.

Second Embodiment

A second embodiment will be described with reference to FIGS. 12 to 16. A circuit device 50 of a second embodiment includes: a circuit assembly 60; a heat sink 70 screwed to the circuit assembly 60; a covering member 80 (corresponding to a fixed member) screwed to the circuit assembly 60; and heat dissipation grease G interposed between the circuit assembly 60 and the heat sink 70, and between the circuit assembly 60 and the covering member 80.

Figure 13:
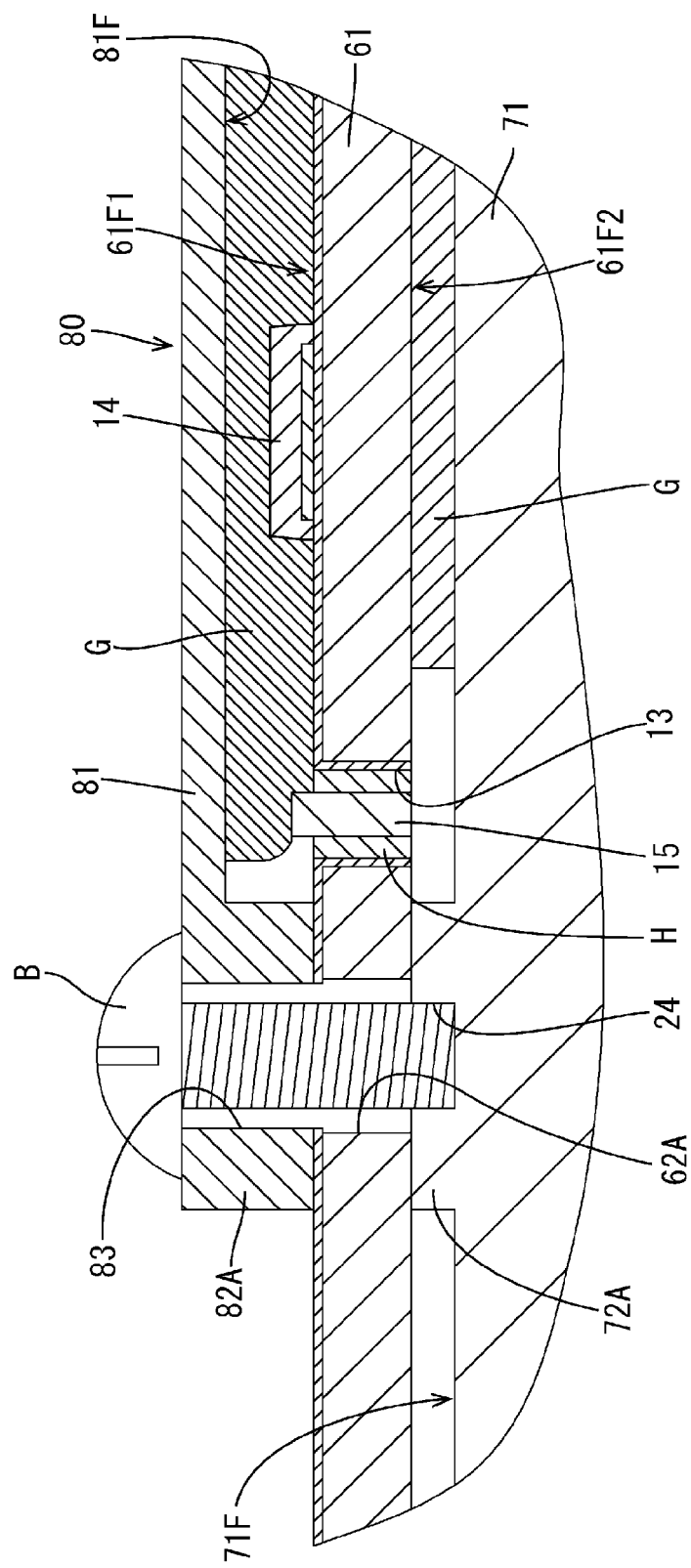
FIG. 13 is a partially enlarged cross-sectional view of the circuit device of the second embodiment taken along line A-A of FIG. 1.
Figure 16:
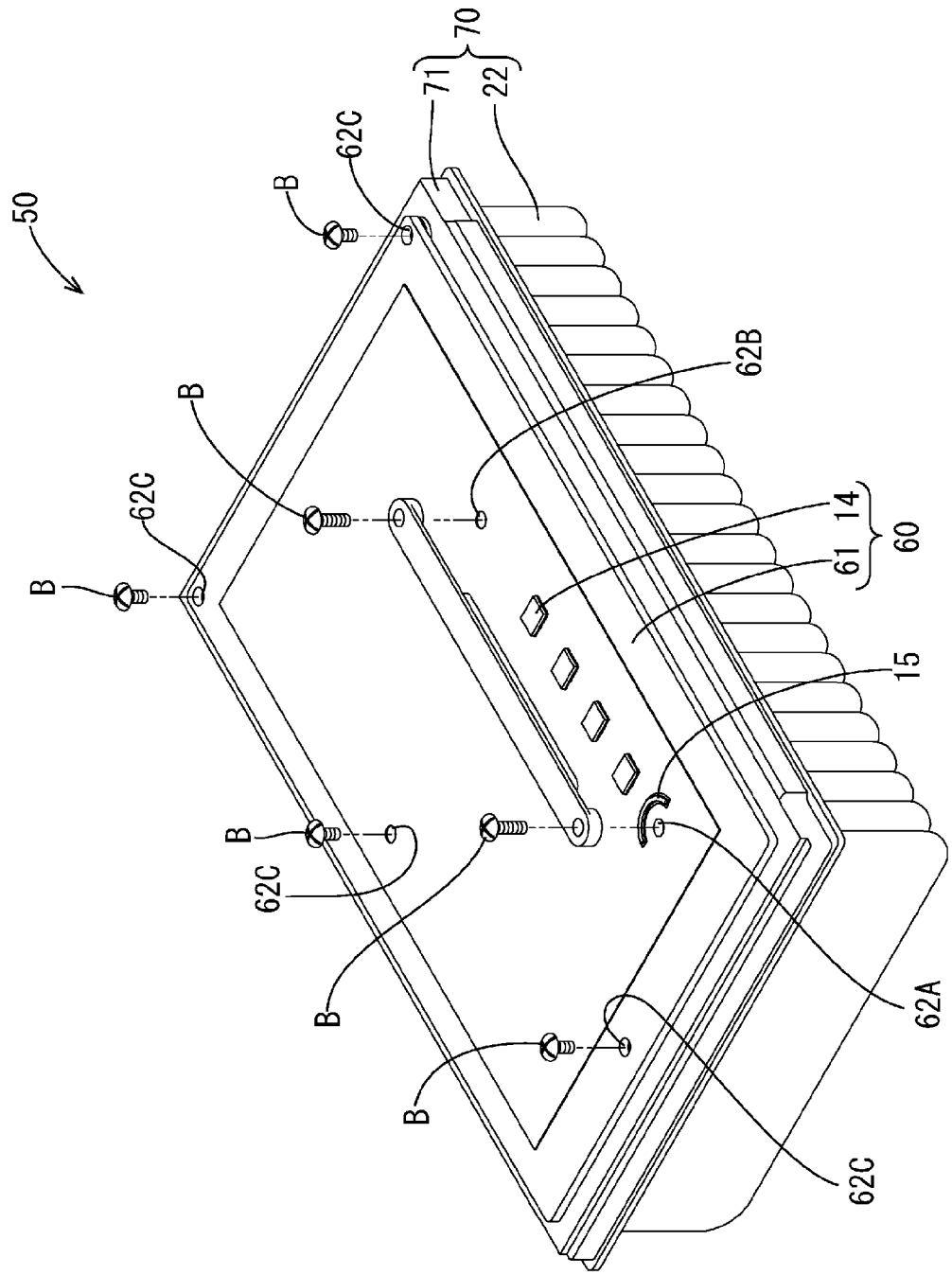
FIG. 16 is a perspective view showing a state in which the covering member and the circuit assembly are assembled to the heat sink in the second embodiment.

Similarly to the first embodiment, the circuit assembly 60 includes a circuit board 61 and a plurality of semiconductor switching elements 14 (corresponding to the heat generating components) mounted on one surface (a mounting surface 61F1: corresponding to a second facing surface) of the circuit board 61 (see FIGS. 13 and 16).

As shown in FIG. 16, the circuit board 61 includes a plurality of screw insertion holes 62A, 62B, and 62C through which screws B for assembling the covering member 80 and the heat sink 70 can be inserted. Two of the plurality of screw insertion holes 62A, 62B, and 62C are first screw insertion hole 62A and the second screw insertion hole 62B that are disposed on opposite sides of the row of the semiconductor switching elements 14. The first screw insertion hole 62A is disposed closer to the row of the semiconductor switching elements 14 than the second screw insertion hole 62B. The plurality of other screw insertion holes 62C are disposed in the circumferential edge portion of the circuit board 61.

Figure 14:
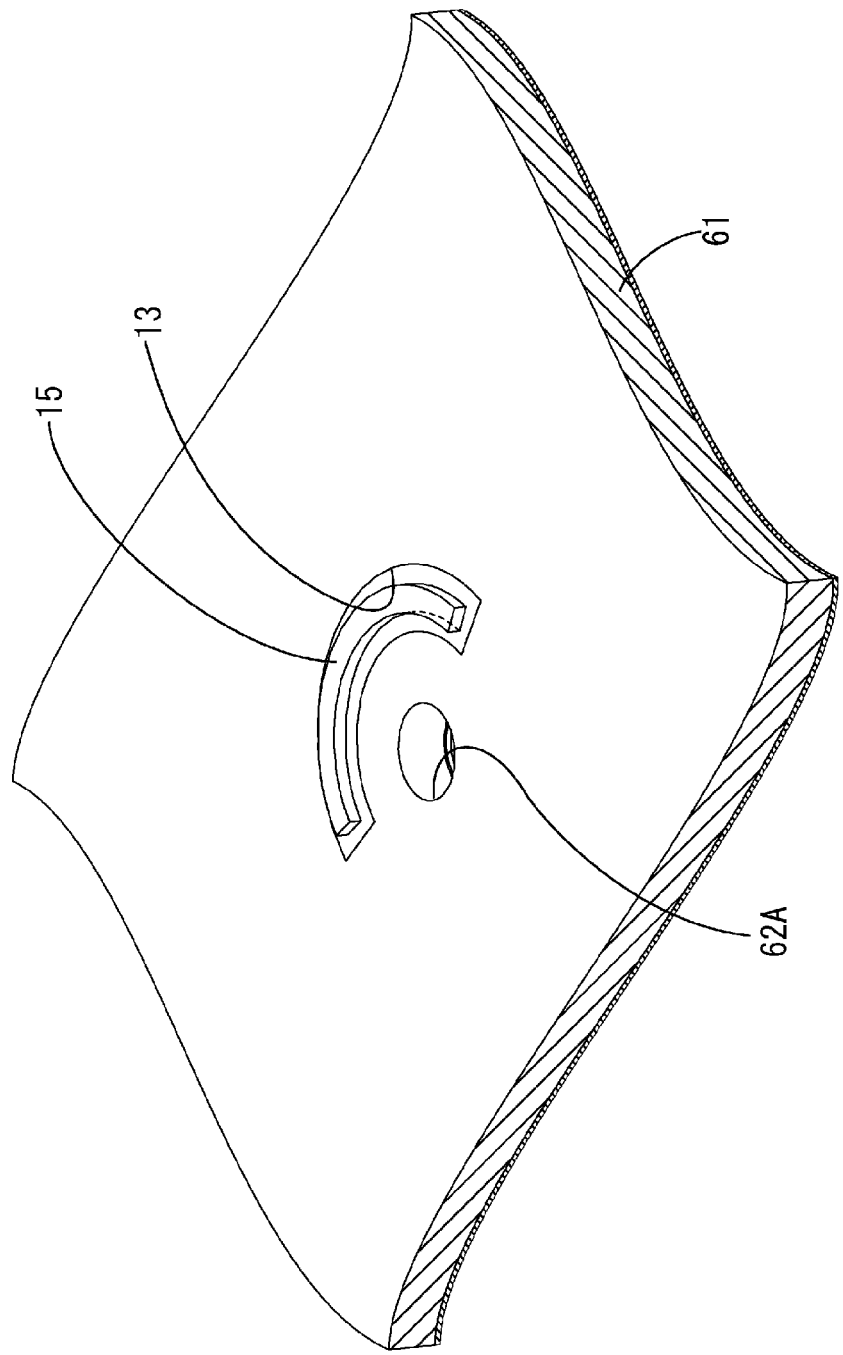
FIG. 14 is a partially enlarged perspective view of a portion on which a shielding wall is mounted in the circuit board of the second embodiment as viewed from a mounting surface side.

The shielding wall 15 is mounted on the circuit board 61. As shown in FIGS. 13 and 14, the shape and the mounting form of the shielding wall 15 are the same as those of the first embodiment, except that a part of the shielding wall 15 is mounted to protrude from the mounting surface 61F1 of the circuit board 61.

Similarly to the first embodiment, the heat sink 70 includes a plate-shaped main plate portion 71 (corresponding to a base portion) disposed to face the circuit board 11, and a plurality of heat dissipation fins 22 protruding from one surface of the main plate portion 71 (see FIG. 16). In the main plate portion 71, a plurality of boss portions serving as pedestals for supporting the circuit board 11 protrude from a heat transfer surface 71F facing the circuit board 11. As shown in FIG. 13, a first boss portion 72A of the plurality of boss portions is disposed at a position corresponding to the first screw insertion hole 62A. Although not shown in detail, the other boss portions are disposed at positions corresponding to the screw insertion holes 62B and 62C of the circuit board 61, respectively. The first boss portion 72A has a cylindrical shape, and as shown in FIG. 13, includes a screw hole 24 that opens to a surface facing the circuit board 11. The same applies to the other boss portions.

Figure 15:
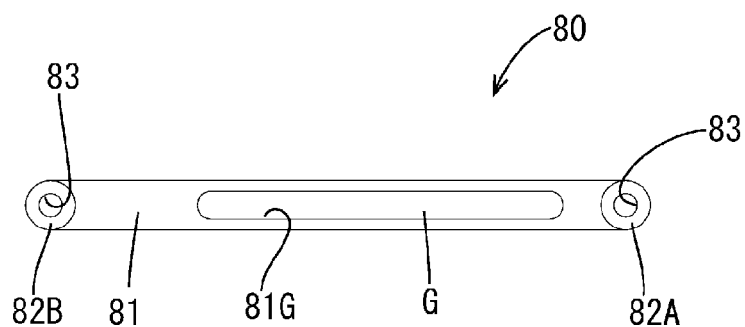
FIG. 15 is a bottom view of a covering member to which the heat dissipation grease is applied in the second embodiment.

As shown in FIG. 15, the covering member 80 includes a covering portion 81 (corresponding to a base portion), and two mounting columns (a first mounting column 82A and a second mounting column 82B) protruding from the covering portion 81. The covering portion 81 is an elongated plate-shaped portion, and one surface of the front and back surfaces is a board facing surface 81F (corresponding to a first facing surface) facing the circuit board 61, as shown in FIG. 13. The two mounting columns 82A and 82B are cylindrical portions protruding from the board facing surface 81F. As shown in FIG. 15, the first mounting column 82A (corresponding to a pedestal portion) is disposed at one end of the covering portion 81, and the second mounting column 82B is disposed at the other end of the covering portion 81. Apart of the region of the board facing surface 81F interposed between the two mounting columns 82A and 82B is a second grease application region 81G (corresponding to a heat transfer material application region) to which the heat dissipation grease G is applied when the circuit board 61 and the covering member 80 are assembled. The second grease application region 81G is disposed closer to the first mounting column 82A than the second mounting column 82B. The covering member 80 includes two through holes 83 penetrating the covering portion 81 and the two mounting columns 82A and 82B.

As shown in FIG. 13, the circuit board 61 is supported on the plurality of boss portions with the surface (a heat dissipation surface 61F2) opposite to the mounting surface 61F1 facing the main plate portion 71. The plurality of screws B are inserted through the plurality of screw insertion holes 62C, and screwed to the plurality of boss portions (not shown) disposed corresponding to the plurality of screw insertion holes 62C. As a result, the circuit board 61 is fixed to the heat sink 70. Between the circuit board 61 and the main plate portion 71, there is a gap corresponding to the height of the boss portions, and similar to the first embodiment, a part of the gap is filled with the heat dissipation grease G.

The covering member 80 is placed on the circuit board 61 so that the board facing surface 81F faces the circuit board 61 and the mounting columns 82A and 82B abuts the mounting surface 61F1, thereby covering the plurality of semiconductor switching elements 14. As shown in FIG. 13, one screw B is inserted into the through hole 83 of the first mounting column 82A and the first screw insertion hole 62A, and is screwed to the first boss portion 72A. The other one screw B is inserted into the through hole 83 of the second mounting column 82B and the second screw insertion hole 62B, and is screwed to the other boss portion (not shown) disposed at a position corresponding to the second screw insertion hole 62B. As a result, the covering member 80 is fixed to the circuit board 61. As shown in FIG. 13, there is a gap corresponding to the height of the mounting columns 82A and 82B between the circuit board 61 and the covering portion 81, and most of the gap except for a portion close to the second mounting column 82B is filled with the heat dissipation grease G. The plurality of the semiconductor switching elements 14 are embedded in the heat dissipation grease G.

Because the other structural features are the same as those of the first embodiment, the same reference numerals are given to the same structural features, and the description thereof will be omitted.

The process of manufacturing the circuit device 50 as described above by assembling the circuit board 61, the heat sink 70, and the covering member 80 will be described below.

The process of assembling the circuit board 61 and the heat sink 70 is the same as that of the first embodiment.

The covering member 80 is assembled to an assembly in which the circuit board 61 and the heat sink 70 are assembled. As shown in FIG. 15, the heat dissipation grease G is applied to the second grease application region 81G of the covering member 80. As shown in FIG. 16, the covering member 80 to which the heat dissipation grease G is applied is placed on the circuit board 61, while the first mounting column 82A and the first screw insertion hole 62A are aligned with each other and the second mounting column 82B and the second screw insertion hole 62B are aligned with each other. In a state in which the covering member 80 is disposed at a predetermined position, the second grease application region 81G is disposed in a region overlapping the plurality of semiconductor switching elements 14 (a region directly above the plurality of semiconductor switching elements 14 in FIG. 13), and the shielding wall 15 extends toward an intermediate region between the second grease application region 81G and the first mounting column 82A in a direction recessed toward the first mounting column 82A side.

Then, one screw B is inserted into the through hole 83 of the first mounting column 82A and the first screw insertion hole 62A, and is screwed to the first boss portion 72A. Similarly, the other one screw B is inserted into the through hole 83 of the second mounting column 82B and the second screw insertion hole 62B, and is screwed to the boss portion (not shown) corresponding to these holes.

Figure 12:
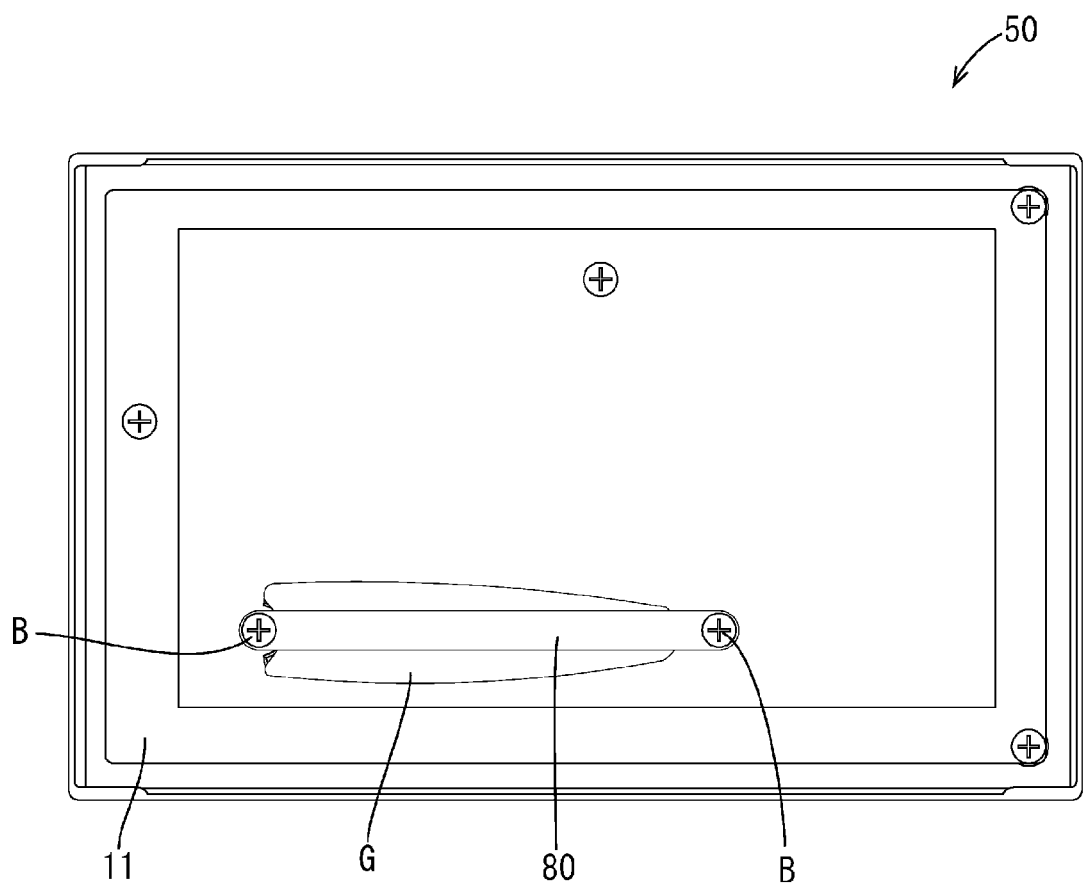
FIG. 12 is a plan view of a circuit device of a second embodiment.

At this time, the heat dissipation grease G is crushed between the covering portion 81 and the circuit board 61 by the pressure applied by fastening the screws B, and spreads to the outside of the second grease application region 81G as shown in FIG. 12. Although a part of the heat dissipation grease G tends to spread toward the first mounting column 82A, the heat dissipation grease G is held up by the shielding wall 15. Here, the shielding wall 15 rises from the circuit board 61 toward the covering portion 81, and the first mounting column 82A hangs from the covering portion 81 toward the circuit board 61. With this configuration, as shown in FIG. 13, even if the heat dissipation grease G runs on the shielding wall 15 and slightly enters the first mounting column 82A from the gap between the shielding wall 15 and the circuit board 61, the heat dissipation grease G is prevented from running over the shielding wall 15 and dripping down and reaching the distal end portion (lower end portion in FIG. 13) of the first mounting column 82A. As a result, the heat dissipation grease G is prevented from entering the gap between the first mounting column 82A and the circuit board 61, and becoming thicker than or equal to a set value. In addition, it is possible to avoid a situation in which the heat dissipation grease G enters the screw hole 24 of the first mounting column 82A, and torque management of the screws B becomes difficult.

As described above, according to the present embodiment, the circuit device 50 includes the circuit assembly 60, the covering member 80, and the heat dissipation grease G. The circuit assembly 60 includes the circuit board 61 and the semiconductor switching elements 14 mounted on the circuit board 61. The covering member 80 includes the covering portion 81 disposed to face the circuit board 61, and the mounting columns 82A and 82B protruding from the covering portion 81 toward the circuit board 61 and abutting the circuit board 61, and is a member fixed to the circuit board 61 by screwing. The heat dissipation grease G is a heat transfer material that is interposed between the circuit board 61 and the covering portion 81, and has fluidity. The covering portion 81 includes, on the board facing surface 81F facing the circuit board 61, the second grease application region 81G to which the heat dissipation grease G is applied. The circuit board 61 includes the shielding wall 15 extending from the mounting surface 11F1 facing the covering portion 81 toward an intermediate region between the first mounting column 82A and the second grease application region 81G in the covering portion 81.

According to the above configuration, when the circuit board 61 and the covering member 80 are screwed to each other, the heat dissipation grease G that is spread between the circuit board 61 and the covering member 80 is held by the shielding wall 15. As a result, it is avoided that the heat dissipation grease G reaches the first mounting column 82A and enters the gap between the first mounting column 82A and the circuit board 61 to cause problems in the assembling process.

Other Embodiments

The technique disclosed in the present specification is not limited to the embodiments described above and illustrated in the drawings, and includes, for example, the following various aspects.

In the above embodiments, the shielding wall 15 is made of metal, and the gap between the inner wall surface of the mounting hole 13 and the shielding wall 15 is filled with the solder H. However, for example, the shielding wall may also be made of synthetic resin, and the gap between the inner wall surface of the mounting hole and the shielding wall may also be filled with an adhesive.

In the above embodiments, the circuit board 11 includes the mounting hole 13 for mounting the shielding wall 15. However, the circuit board may also not include a mounting hole, and the shielding wall may also be fixed to the surface of the circuit board by soldering or an adhesive.

In the above embodiments, the heat generating component is a semiconductor switching element. However, the heat generating component may also be, for example, a resistor or a coil.

In the above embodiments, heat dissipation grease is used as a heat transfer material. However, an adhesive that has fluidity immediately after being applied and is cured thereafter may also be used.

The invention claimed is:

1. A circuit device, comprising:
a circuit assembly including a circuit board;
a fixed member that includes a base portion disposed to face the circuit board, and a pedestal portion protruding from the base portion toward the circuit board and abutting the circuit board, and that is fixed to the circuit board by screwing; and
a heat transfer material interposed between the circuit board and the base portion, and having fluidity, wherein
the base portion includes, on a first facing surface facing the circuit board, a heat transfer material application region to which the heat transfer material is applied,
the circuit board includes a shielding wall extending from a second facing surface facing the base portion toward an intermediate region between the pedestal portion and the heat transfer material application region in the base portion,
there is a gap between the shielding wall and the base portion, and
the base portion includes a groove that is recessed from the first facing surface at a position overlapping the shielding wall.

2. The circuit device according to claim 1, wherein the fixed member is a heat dissipation member.

3. The circuit device according to claim 1, wherein the circuit assembly includes a heat generating component that is mounted on the circuit board and generates heat when electricity flows therethrough, and
the fixed member is a covering member that covers the heat generating component.

\* \* \* \* \*